United States Patent
Toyama

(10) Patent No.: US 9,537,019 B2
(45) Date of Patent: Jan. 3, 2017

(54) SEMICONDUCTOR DEVICE

(71) Applicant: ROHM CO., LTD., Kyoto (JP)

(72) Inventor: Tomoichiro Toyama, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 14/566,197

(22) Filed: Dec. 10, 2014

(65) Prior Publication Data

US 2015/0162456 A1    Jun. 11, 2015

(30) Foreign Application Priority Data

Dec. 11, 2013 (JP) ................. 2013-255857

(51) Int. Cl.
| | |
|---|---|
| H01L 31/0203 | (2014.01) |
| H01L 31/0236 | (2006.01) |
| H01L 31/02 | (2006.01) |
| H01L 33/54 | (2010.01) |
| H01L 33/48 | (2010.01) |

(52) U.S. Cl.
CPC ..... *H01L 31/0203* (2013.01); *H01L 31/02002* (2013.01); *H01L 31/02366* (2013.01); *H01L 33/54* (2013.01); *H01L 33/486* (2013.01); *H01L 2224/32225* (2013.01); *H01L 2224/48091* (2013.01); *H01L 2224/48227* (2013.01)

(58) Field of Classification Search
CPC ................ H01L 33/54; H01L 33/486
See application file for complete search history.

(56) References Cited

U.S. PATENT DOCUMENTS

| | | | | |
|---|---|---|---|---|
| 5,298,768 A | * | 3/1994 | Okazaki | H01L 33/486 257/100 |
| 6,217,987 B1 | * | 4/2001 | Ono | G03F 7/032 174/250 |
| 2006/0022215 A1 | * | 2/2006 | Arndt | H01L 33/486 257/99 |
| 2010/0148196 A1 | * | 6/2010 | Kamada | F21K 9/00 257/98 |
| 2011/0303945 A1 | * | 12/2011 | Zitzlsperger | H01L 21/4842 257/99 |
| 2012/0074445 A1 | * | 3/2012 | Shimonishi | H01L 33/60 257/98 |

FOREIGN PATENT DOCUMENTS

JP    2012-186450    9/2012

* cited by examiner

*Primary Examiner* — Anthony Ho
*Assistant Examiner* — Victor Barzykin
(74) *Attorney, Agent, or Firm* — Hamre, Schumann, Mueller & Larson, P.C.

(57) ABSTRACT

A semiconductor device includes a base, a semiconductor element disposed on the base, a resist layer formed on the base, and a resin-sealed portion covering the semiconductor element and the resist layer. A plurality of concave portions is formed in the resist layer, and each of the plurality of concave portions is filled with a part of the resin-sealed portion.

31 Claims, 11 Drawing Sheets

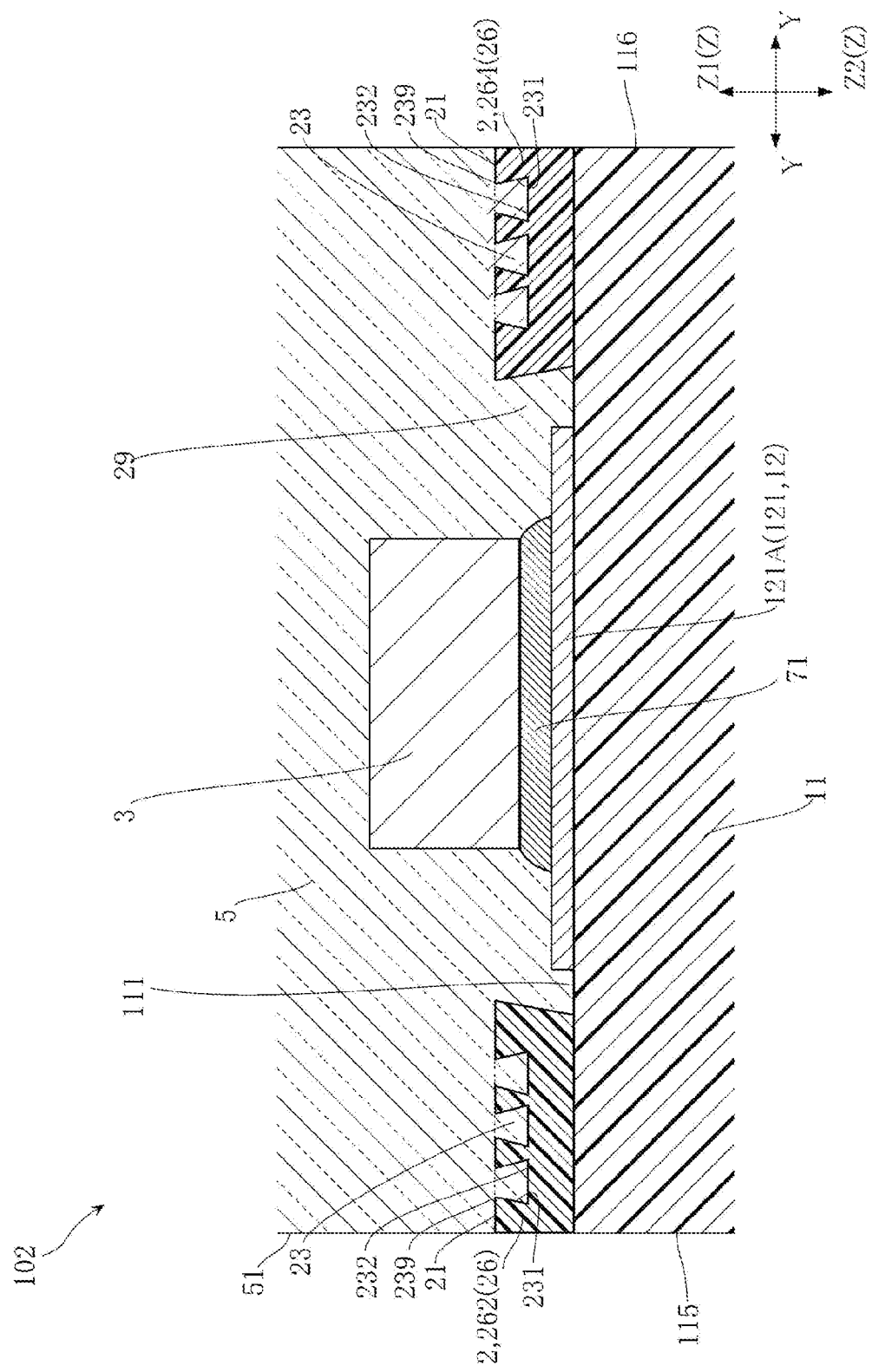

SEMICONDUCTOR DEVICE

CROSS-REFERENCE TO RELATED APPLICATION

This application is based upon and claims the benefit of priority from Japanese Patent Application No. 2013-255857, filed on Dec. 11, 2013, the entire contents of which are incorporated herein by reference.

TECHNICAL FIELD

The present disclosure relates to a semiconductor device.

BACKGROUND

There is a semiconductor device as an LED module. The semiconductor device includes a substrate, an LED chip disposed on the substrate, and a sealed resin formed on the substrate to cover the LED chip.

Such a LED module is subjected to a heating treatment when it is mounted on a circuit board. In conventional LED modules, the sealed resin may be thermally deformed and, accordingly, the LED chip may be separated or peeled off from the circuit board along with the sealed resin.

SUMMARY

The present disclosure provides some embodiments of a semiconductor device which is capable of preventing a semiconductor device from being separated or peeled off from a base if the semiconductor device is mounted on a circuit board.

According to one embodiment of the present disclosure, there is provided a semiconductor device including: a base; a semiconductor element disposed on the base; a resist layer formed on the base; and a resin-sealed portion covering the semiconductor element and the resist layer, wherein a plurality of concave portions is formed in the resist layer, and each of the plurality of concave portions is filled with a part of the resin-sealed portion.

Each of the plurality of concave portions may have a concave portion side in contact with the resin-sealed portion, and the concave portion side may be inclined with respect to a thickness direction of the base such that the opening area of the concave portion is increased as the concave portion becomes closer to the base.

Each of the plurality of concave portions may have a shape which falls within a circle having a diameter of 0.5 mm.

The base may have a base front surface on which the resist layer is formed, the resist layer may have a resist layer front surface which is disposed to face in the same direction as the base front surface, and each of the plurality of concave portions may have a shape recessed from the resist layer front surface.

An edge of each of the plurality of concave portions may form a closed line when viewed in the thickness direction of the base.

Each of the plurality of concave portions may have a circular shape when viewed in the thickness direction of the base.

At least one of the plurality of concave portions may penetrate through the resist layer.

At least one of the plurality of concave portions may have a concave portion bottom surface defined by the resist layer.

The plurality of concave portions may include a first and a second concave portions located opposite to each other in parallel to the thickness direction of the base, with a virtual plane passing through the semiconductor element interposed therebetween.

The plurality of concave portions may be arranged to surround the semiconductor element in the thickness direction of the base.

The semiconductor device may further include a front surface electrode formed on the base, and the plurality of concave portions may be formed in a region of the base which does not overlap with the front surface electrode when viewed in the thickness direction of the base.

The front surface electrode may include a die bonding portion on which the semiconductor element is disposed.

The resist layer may be made of epoxy resin or a pigment.

The thickness of the resist layer may be 20 to 100 μm.

The resist layer may include a plurality of island portions, the island portions may be separated from each other via a gap, and one or more of the concave portions may be formed in at least one of the island portions.

The dimension of the resin-sealed portion in the thickness direction of the base may range from 0.3 mm to 3.0 mm.

A proportion of the area occupied by the resin-sealed portion with respect to the base in the thickness direction of the base may range from 10% to 100%.

The resin-sealed portion may have an outer surface oriented from the base, and the outer surface may be exposed to an external space of the semiconductor device.

A part of the resin-sealed portion forming the outer surface may have the same material as a part of the resin-sealed portion in contact with the semiconductor element.

A linear expansion coefficient of a material of the resin-sealed portion may be larger than that of a material of the base.

The linear expansion coefficient of the material of the resin-sealed portion may be larger than that of the material of the resist layer.

The linear expansion coefficient may be 10 to 500 ppm/K for the material of the resin-sealed portion, the linear expansion coefficient may be 10 to 500 ppm/K for the material of the resist layer, and the linear expansion coefficient may be 10 to 500 ppm/K for the material of the base.

The resin-sealed portion may be made of epoxy resin, silicone resin, acryl resin or polyvinyl resin.

The resin-sealed portion may be in contact with the base.

The semiconductor element may be an optical element, and the resin-sealed portion may be made of a transparent material.

The optical element may be a light emitting element or a light receiving element.

The semiconductor device may further include a bonding layer interposed between the semiconductor element and the base.

The bonding layer may be made of Ag.

The semiconductor device may further include: a front surface electrode formed on the base; and a wire bonded to the semiconductor element and the front surface electrode.

The semiconductor device may further include a rear surface electrode which is formed on the base and electrically connected with the semiconductor element, and the rear surface electrode may be located opposite to the side where the semiconductor element is disposed, with the base interposed therebetween.

The base may be made of insulating resin or ceramics.

These and other features and advantages of the present disclosure will be more apparent in the following description in conjunction with the accompanying drawings.

BRIEF DESCRIPTION OF THE DRAWINGS

FIG. 11 is a partial sectional view of a semiconductor device according to a second modification of the first embodiment of the present disclosure.

DETAILED DESCRIPTION

Some embodiments of the present disclosure will now be described in detail with reference to the drawings.

First Embodiment

A first embodiment of the present disclosure will be described below with reference to FIGS. 1 to 9.

Figure 1:
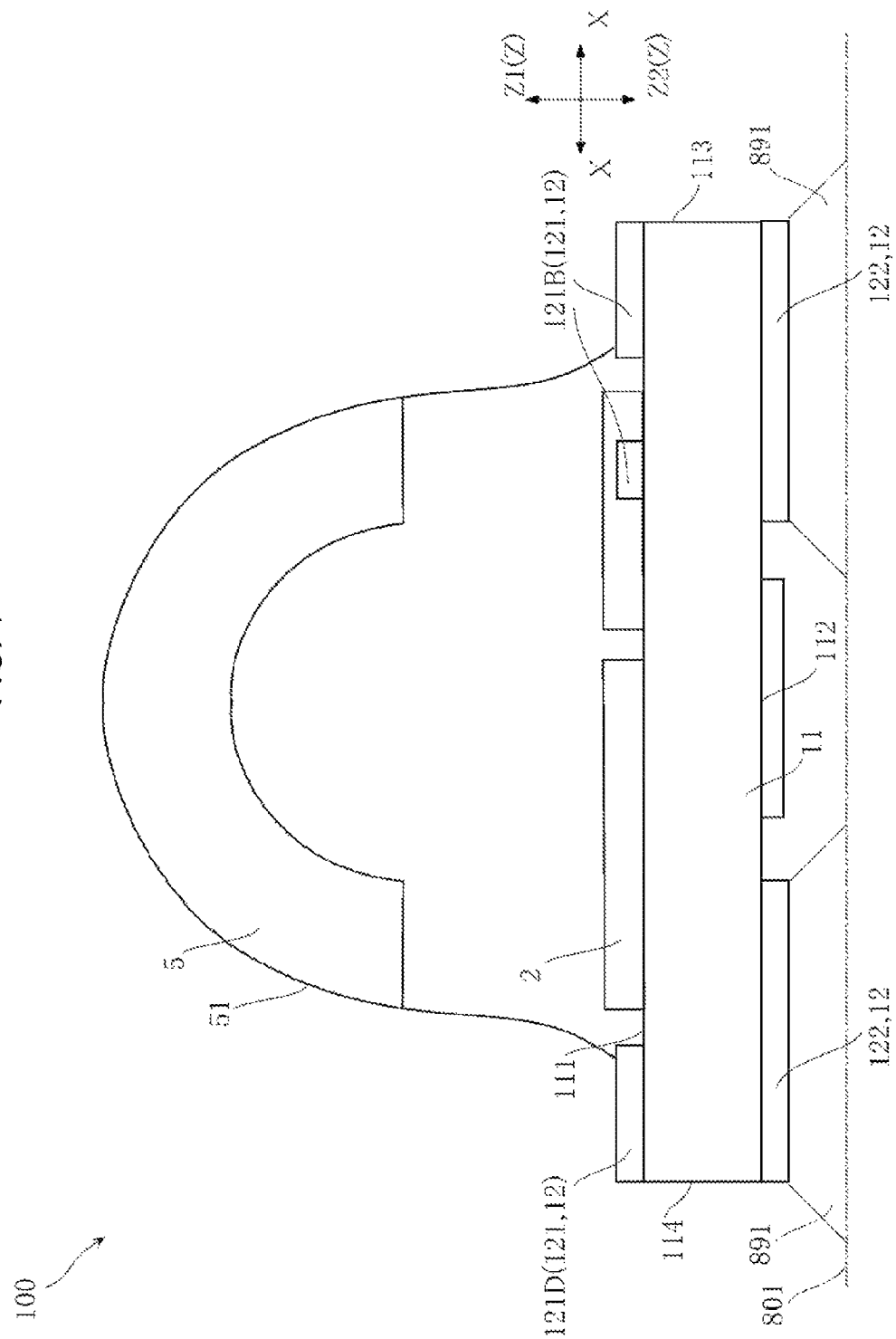
FIG. 1 is a front view of a semiconductor device according to a first embodiment of the present disclosure.
Figure 2:
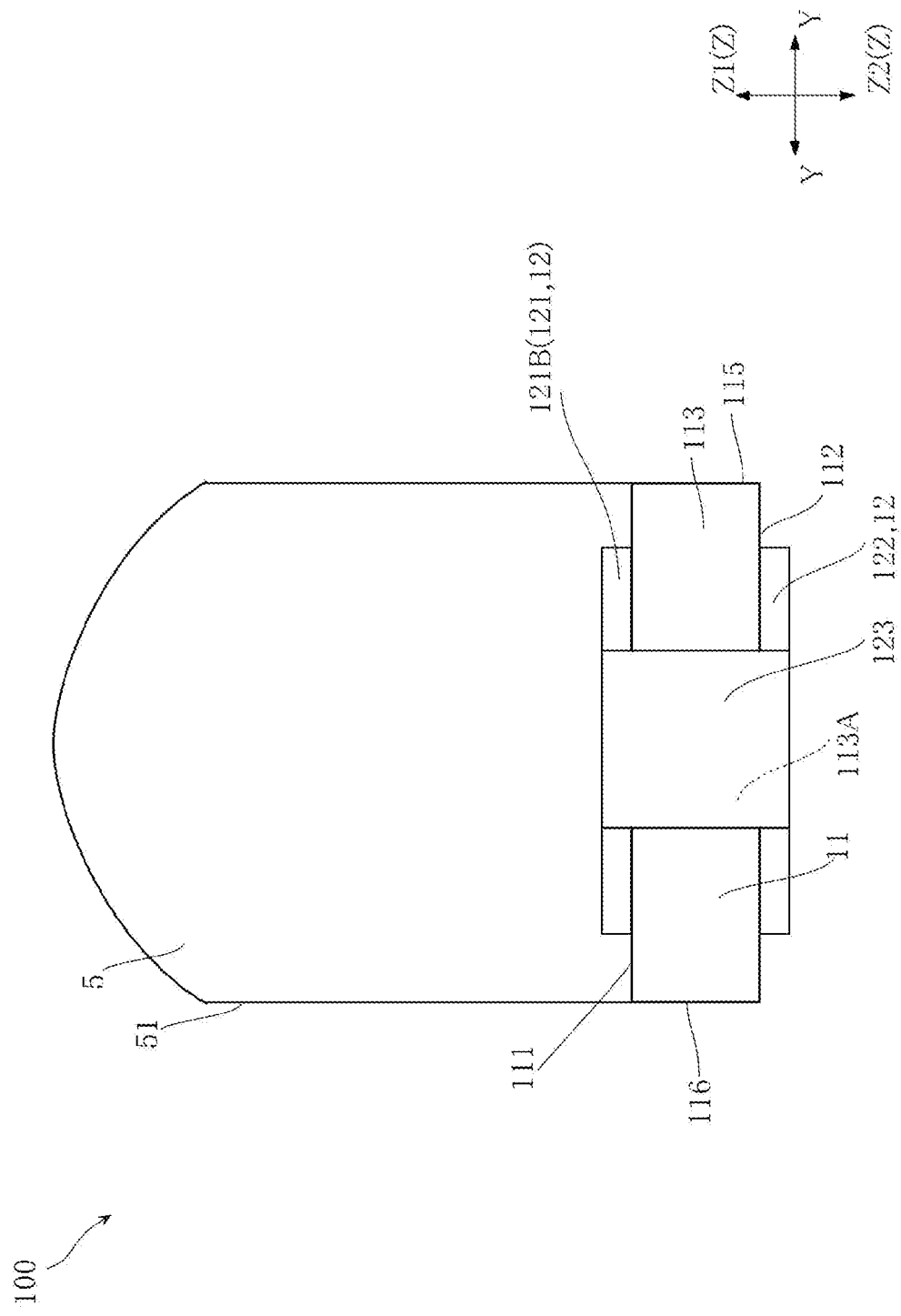
FIG. 2 is a right side view of the semiconductor device shown in FIG. 1.
Figure 3:
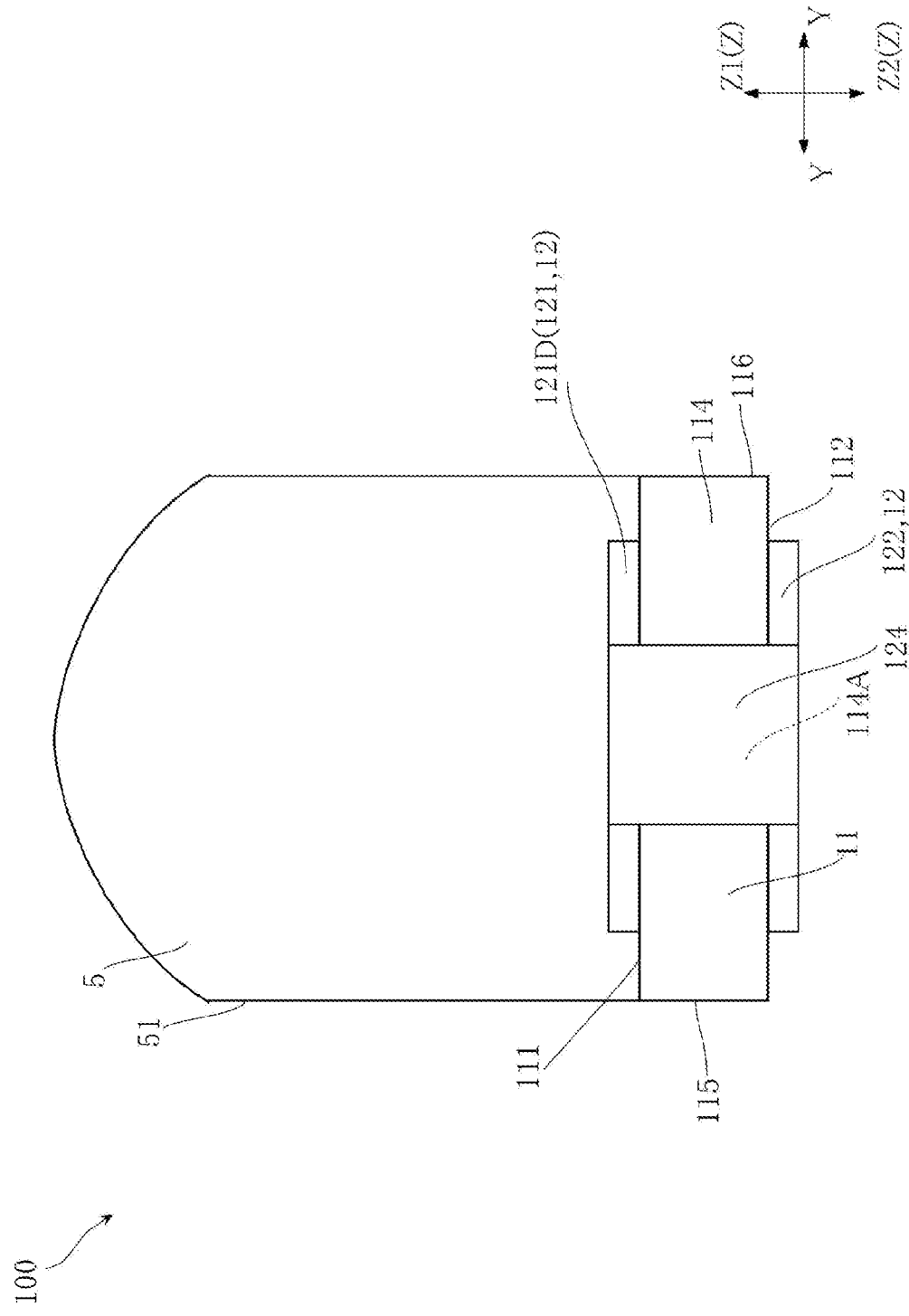
FIG. 3 is a left side view of the semiconductor device shown in FIG. 1.
Figure 4:
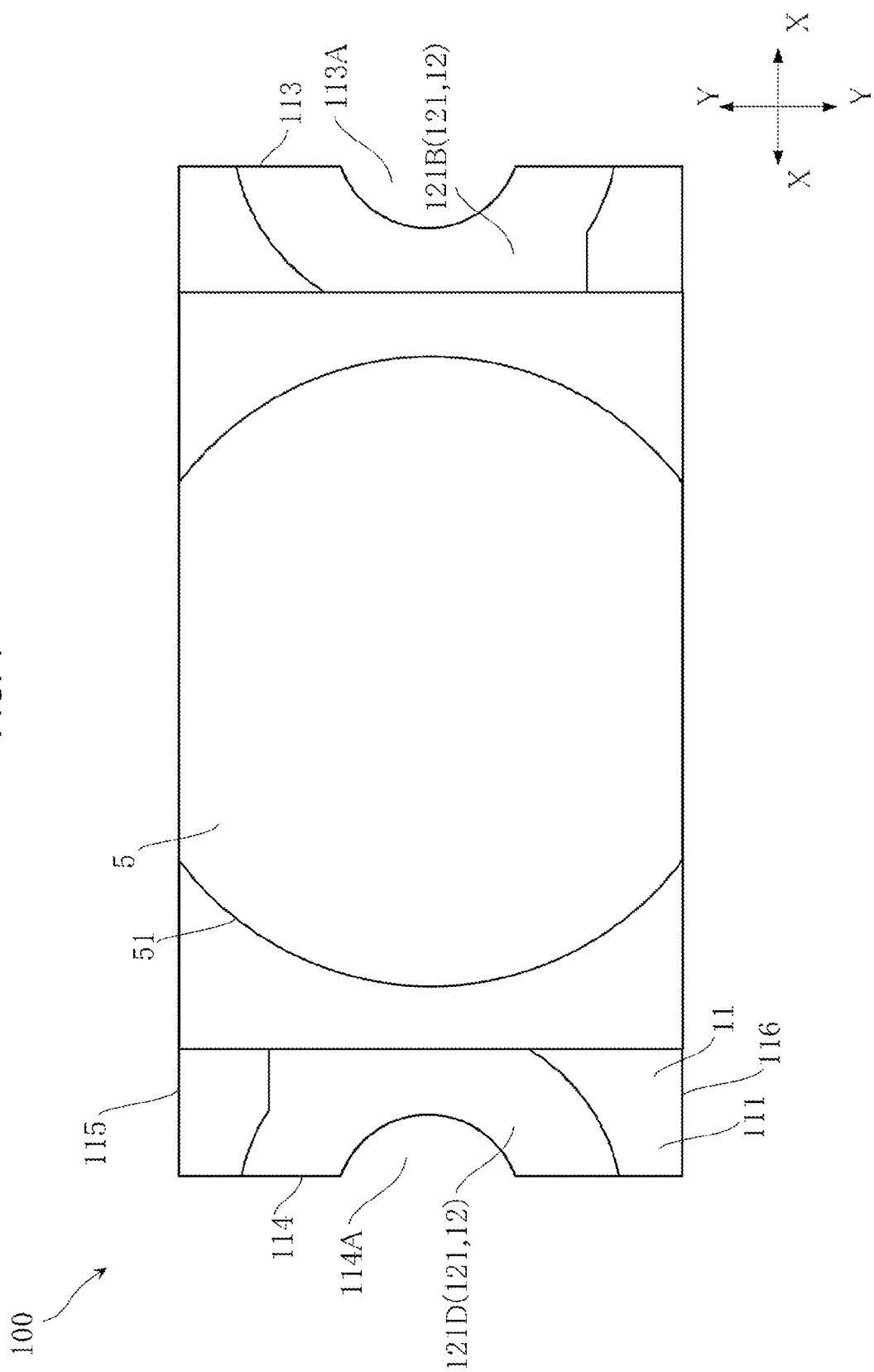
FIG. 4 is a plan view of the semiconductor device shown in FIG. 1.
Figure 5:
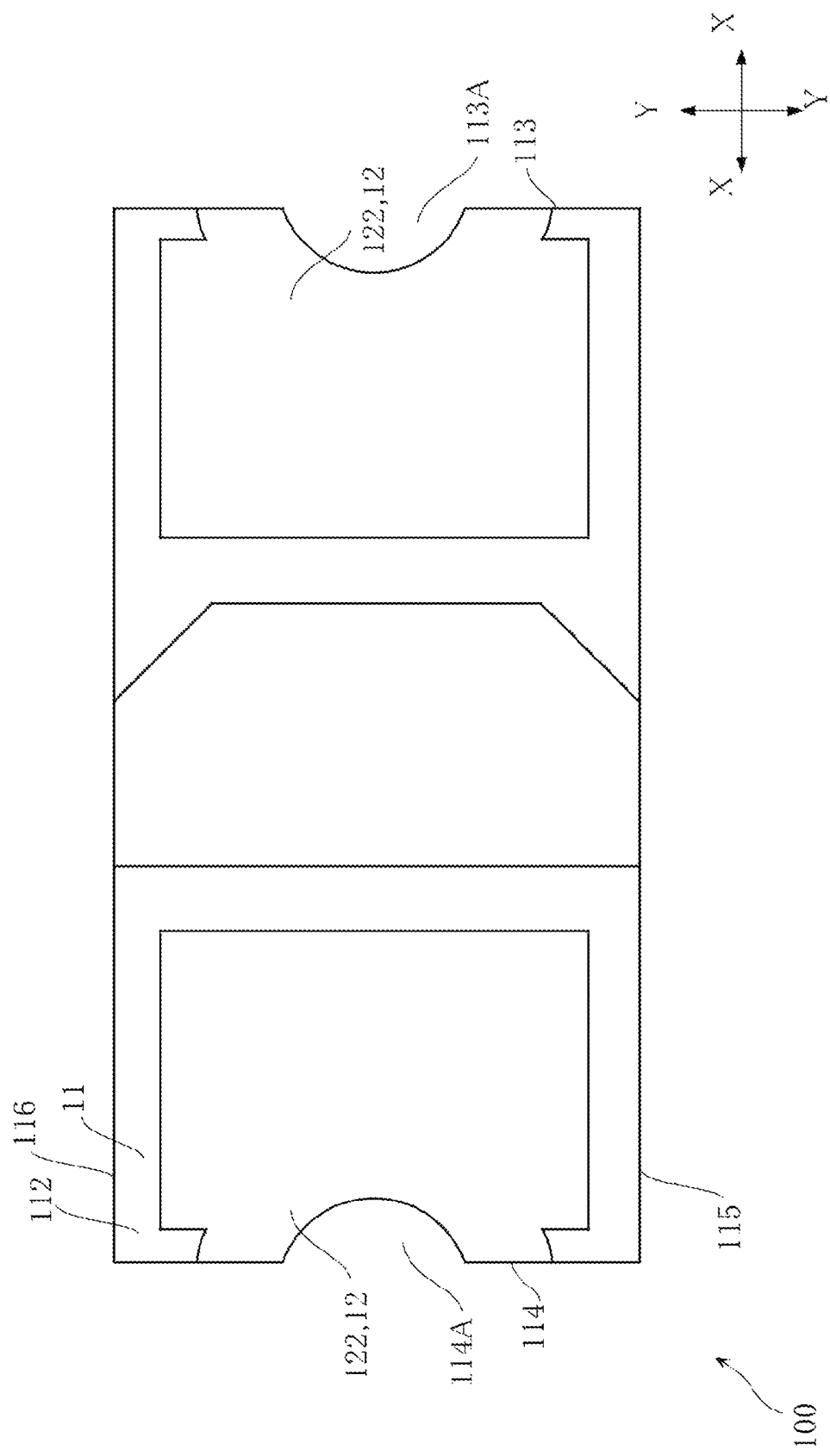
FIG. 5 is a bottom view of the semiconductor device shown in FIG. 1.
Figure 6:
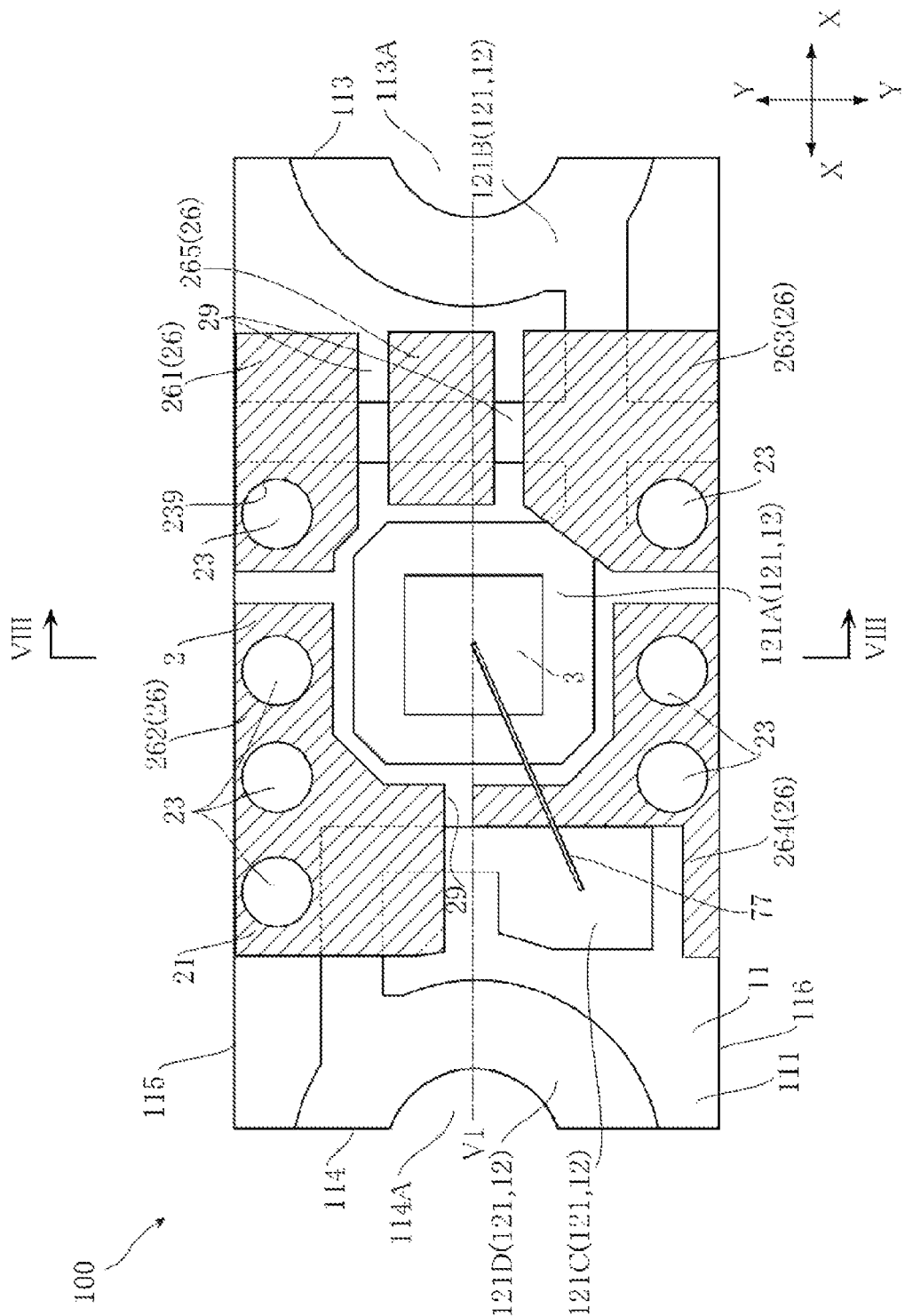
FIG. 6 is a plan view in which a resin-sealed portion is omitted from FIG. 4.
Figure 7:
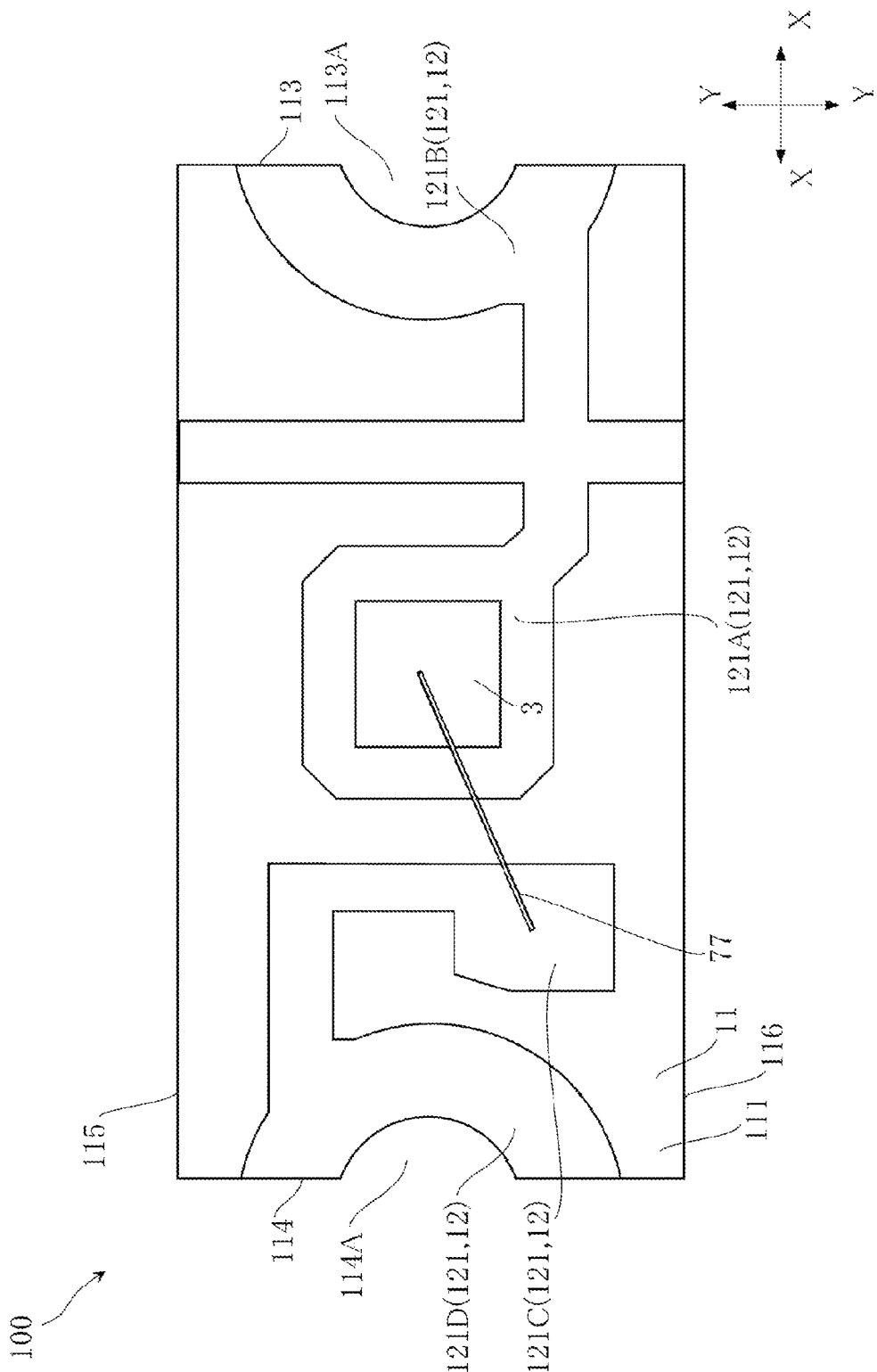
FIG. 7 is a plan view in which a resist layer is omitted from FIG. 6.
Figure 8:
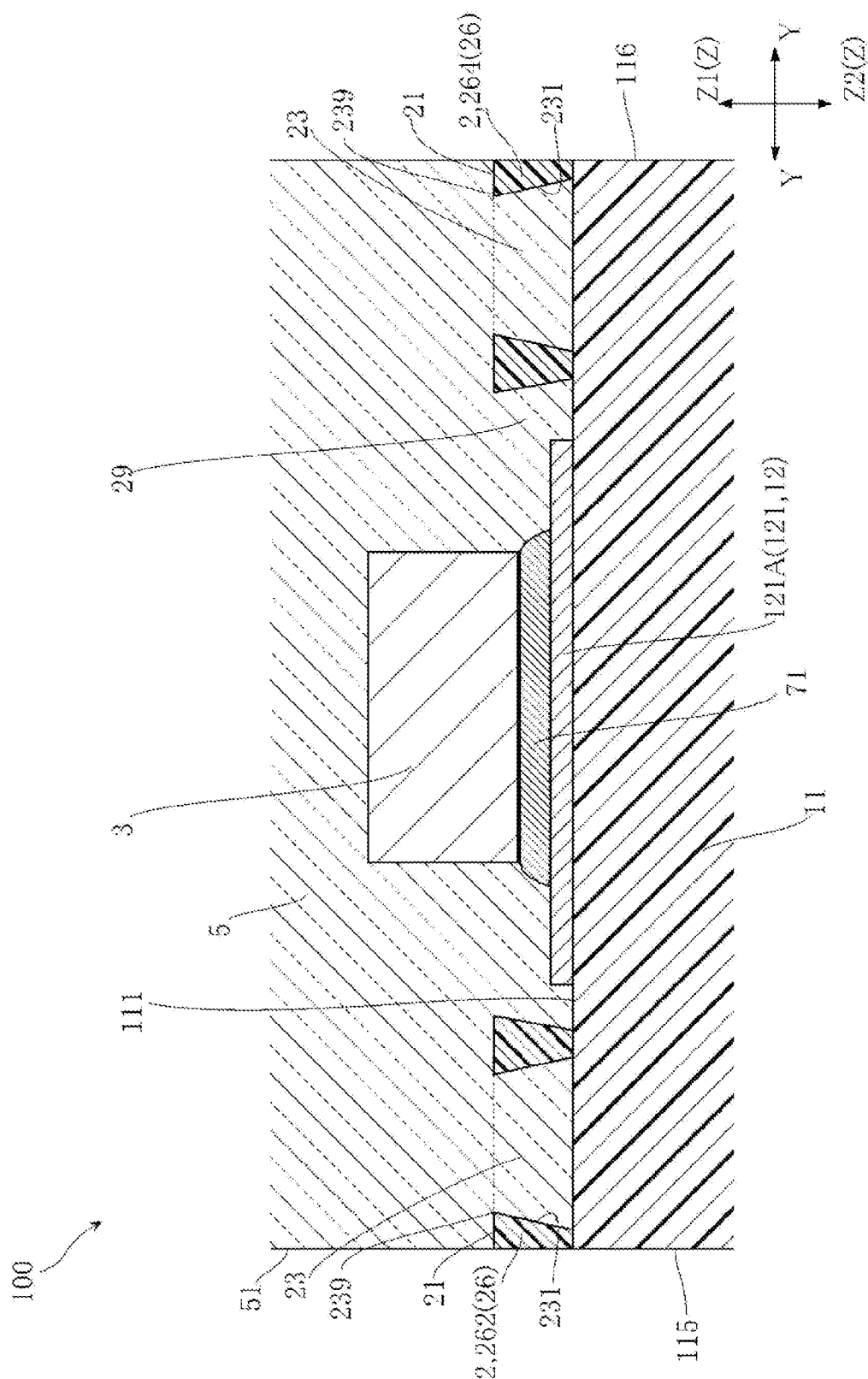
FIG. 8 is a sectional view taken along line VIII-VIII in FIG. 6.

FIG. 1 is a front view of a semiconductor device according to a first embodiment of the present disclosure. FIG. 2 is a right side view of the semiconductor device shown in FIG. 1. FIG. 3 is a left side view of the semiconductor device shown in FIG. 1. FIG. 4 is a plan view of the semiconductor device shown in FIG. 1. FIG. 5 is a bottom view of the semiconductor device shown in FIG. 1. FIG. 6 is a plan view in which a resin-sealed portion is omitted from the semiconductor device of FIG. 4. FIG. 7 is a plan view in which a resist layer is omitted from the semiconductor device FIG. 6. FIG. 8 is a sectional view taken along line VIII-VIII in FIG. 6.

Referring to FIG. 1, a semiconductor device 100 is disposed on a circuit board 801 via conductive bonding members 891 (e.g., solders).

As clearly shown, particularly in FIGS. 6 and 8, the semiconductor device 100 includes a base 11, a wiring pattern 12, a resist layer 2, a semiconductor element 3, a resin-sealed portion 5, a bonding layer 71 (not shown in FIGS. 6 and 7, see FIG. 8) and a wire 77 (not shown in FIG. 8, see FIG. 6).

The base 11 shown in FIGS. 1 to 8 is provided to dispose the semiconductor element 3 thereon. In this embodiment, the base 11 has a rectangular shape when viewed from top.

In this embodiment, the base 11 is made of an insulating material. For example, the insulating material may include, but is not limited to, insulating resin such as glass epoxy resin, or ceramics such as $Al_2O_3$, SiC or AlN.

Alternatively, the base 11 may be a substrate made of metal, such as aluminum, and formed thereon with an insulating film.

The dimension or size of the base 11 in a thickness direction Z is, for example, 0.04 to 0.06 mm, its dimension or size in a first direction X is, for example, 0.3 to 5 mm, and, its dimension or size in a second direction Y is, for example, 0.3 to 5 mm.

As shown in FIGS. 1 and 4 to 7 and so on, the base 11 has a base front surface 111, a base rear surface 112, a first base side surface 113, a second base side surface 114, a first base end surface 115 and a second base end surface 116.

As shown in FIG. 1, the base front surface 111 and the base rear surface 112 are disposed to face each other. The base front surface 111 is disposed to face in the same direction as one side (i.e., upper side) of the thickness direction Z (hereinafter referred to as direction Z1). The base rear surface 112 is disposed to face in the same direction as the other side (i.e., lower side) of the thickness direction Z (hereinafter referred to as direction Z2). Both of the base front surface 111 and the base rear surface 112 may be flat and have an elongated rectangular shape.

As shown in FIG. 4, all of the first base side surface 113, the second base side surface 114, the first base end surface 115 and the second base end surface 116 are disposed to face a direction intersecting the thickness direction Z of the base 11 (e.g., perpendicular to the thickness direction Z). All of the first base side surface 113, the second base side surface 114, the first base end surface 115 and the second base end surface 116 are connected to the base front surface 111 and the base rear surface 112. The first base side surface 113 and the second base side surface 114 are located in the opposite side in the first direction X of the base 11. The first base side surface 113 is located at one end of the base 11 in the first direction X. The second base side surface 114 is located at the other end of the base 11 in the first direction X. The first base end surface 115 and the second base end surface 116 are located in the opposite side in the second direction Y of the base 11. The first base end surface 115 is located at one end of the base 11 in the second direction Y. The second base end surface 116 is located at the other end of the base 11 in the second direction Y. In this embodiment, all of the first base side surface 113, the second base side surface 114, the first base end surface 115 and the second base end surface 116 are flat.

As shown in FIGS. 2 to 7, in this embodiment, a first concave portion 113A and a second concave portion 114A are formed in the base 11.

The first concave portion 113A has a shape recessed from the first base side surface 113. The second concave portion 114A has a shape recessed from the second base side surface 114. According to another embodiment, the first concave portion 113A and the second concave portion 114A may not be formed in the base 11.

As shown in FIGS. 2 and 4, the wiring pattern 12 is formed in the base 11. The wiring pattern 12 may be use to supply power to the semiconductor element 3. The wiring pattern 12 is made of conductive material such as Au, Ag or Cu.

As shown in FIGS. 1 to 8, the wiring pattern includes a front surface electrode 121, a rear surface electrode 122, a first contact electrode 123 and a second contact electrode 124.

As shown in FIGS. 6 and 7, the front surface electrode 121 is formed in the base front surface of the base 11. The front surface electrode 121 has a predetermined pattern shape in the thickness direction Z of the base 11. The pattern shape of the front surface electrode 121 may be appropriately changed. The semiconductor element 3 and the wire 77 are bonded to the front surface electrode 121.

The front surface electrode 121 includes a die bonding portion 121A, a first wiring portion 121B, a wire bonding portion 121C and a second wiring portion 121D.

The die bonding portion 121A is provided to dispose the semiconductor element 3 thereon. The first wiring portion 121B is connected to the die bonding portion 121A. In this embodiment, the first wiring portion 121B may include a plurality of stripped portions and a semi-annular portion. The wire bonding portion 121C is provided to bond the wire 77. The second wiring portion 121D is connected to the first wiring portion 121B. In this embodiment, the second wiring portion 121D may include a plurality of stripped portions and a semi-annular portion.

As shown in FIG. 5, the rear surface electrode 122 is formed in the base rear surface 112 of the base 11. That is, the rear surface electrode 122 is located opposite to the portion where the semiconductor element 3 is disposed, with the base 11 interposed therebetween.

In this embodiment, the rear surface electrode 122 has two parts. One part (located in the right side in FIG. 5) of the rear surface electrode 122 may be electrically connected with the die bonding portion 121A and the first wiring portion 121B. The other part (located in the left side in FIG. 5) of the rear surface electrode 122 may be electrically connected with the wire bonding portion 121C and the second wiring portion 121D.

The first contact electrode 123 shown in FIG. 2 may allow an electrical connection between the front surface electrode 121 and the rear surface electrode 122. In a detailed example, the first contact electrode 123 electrically connects the die bonding portion 121A to the one part (located in the right side in FIG. 5) of the rear surface electrode 122. In this embodiment, the first contact electrode 123 is formed in the inner surface of the first concave portion 113A. The first contact electrode 123 is connected to the first wiring portion 121B in the front surface electrode 121 and the one part (located in the right side in FIG. 5) of the rear surface electrode 122. According to another embodiment, the first contact electrode 123 may be a through-hole electrode formed in the base 11.

The second contact electrode 124 shown in FIG. 3 may allow an electrical connection between the front surface electrode 121 and the rear surface electrode 122. In a detailed example, the second contact electrode 124 electrically connects the wire bonding portion 121C to the other part (located in the left side in FIG. 5) of the rear surface electrode 122. In this embodiment, the second contact electrode 124 is formed in the inner surface of the second concave portion 114A. The second contact electrode 124 is connected to the second wiring portion 121D in the front surface electrode 121 and the other part (located in the left side in FIG. 5) of the rear surface electrode 122. According to another embodiment, the second contact electrode 124 may be a through-hole electrode formed in the base 11.

The resist layer 2 shown in FIGS. 6 and 8 is formed on the base 11. Specifically, the resist layer 2 is formed on the base front surface 111 of the base 11. The resist layer 2 is made of an insulating material such as epoxy resin or a pigment. The thickness of the resist layer 2 may be, for example, about 20 to 40 μm. The resist layer 2 may be in a direct contact with the base front surface 111 of the base 11. The front surface electrode 121 is interposed between the resist layer 2 and the base front surface 111.

The resist layer 2 has a resist layer front surface 21. The resist layer front surface 21 is disposed to face in the same direction as the base front surface 111.

A plurality of concave portions 23 is formed in the resist layer 2.

Figure 9:
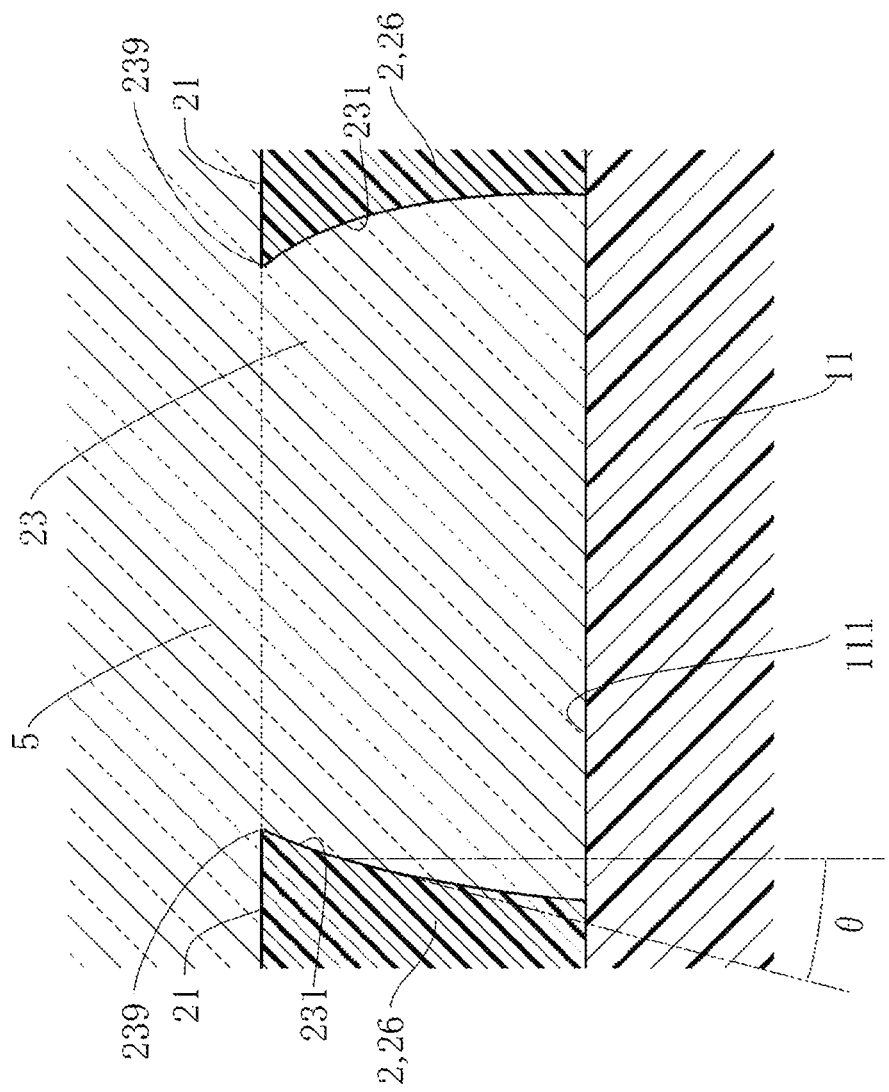
FIG. 9 is an enlarged sectional view of a concave portion in the resist layer.

FIG. 9 is an enlarged sectional view of the concave portion 23 in the resist layer 2.

Each of the plurality of concave portions 23 shown in FIGS. 6, 8 and 9 has a shape recessed from the resist layer front surface 21. Each of the plurality of concave portions 23 has a shape which falls within a circle having a diameter of about 0.5 mm, about 0.2 mm, or about 0.12 mm. An edge 239 of each of the plurality of concave portions 23 forms a closed line when viewed in the thickness direction Z of the base 11. Each of the plurality of concave portions 23 may have one of a circular shape, an elliptical shape, and a polygonal shape when viewed in the thickness direction Z of the base 11. In this embodiment, each of the plurality of concave portions 23 has a circular shape when viewed in the thickness direction Z of the base 11. Any two of the plurality of concave portions 23 are located opposite to each other in parallel to the thickness direction Z of the base 11, with a virtual plane V1 passing through the semiconductor element 3 interposed therebetween. In this embodiment, a group of four concave portions 23 and a group of three concave portions 23 are located opposite to each other in parallel to the thickness direction Z of the base 11, with the virtual plane V1 passing through the semiconductor element 3 interposed therebetween. In this embodiment, the plurality of concave portions 23 is formed in a region of the base 11 which does not overlap with the front surface electrode 121 when viewed in the thickness direction Z of the base 11. According to another embodiment, the plurality of concave portions 23 may be formed in a region of the base 11 which overlaps with the front surface electrode 121 when viewed in the thickness direction Z of the base 11.

As shown in FIGS. 8 and 9, at least one of the plurality of concave portions 23 (in this embodiment, all of the plurality of concave portions 23) penetrates through the resist layer 2. In this case, some parts of the base front surface 111 may be exposed from the concave portion 23 formed in the resist layer 2.

As shown in FIGS. 8 and 9, each of the plurality of concave portions 23 has a concave portion side 231 in contact with the resin-sealed portion 5. In this embodiment, the concave portion side 231 is inclined with respect to the thickness direction Z of the base 11 in such a manner that the opening area of the concave portion 23 increases as the concave portion 23 becomes closer to the base 11. In such a manner, the concave portion side 231 has a tapered shape. In this embodiment, an angle θ (see FIG. 9) forming between the concave portion side 231 and the direction Z2 decreases as the concave portion 23 becomes closer to the base 11.

As shown in FIG. 6, the resist layer 2 includes a plurality of island portions 26. The island portions 26 are separated from each other via a gap 29. In this embodiment, five island portions 261, 262, 263, 274 and 265 are separated from each other via the gap 29. One or more of the concave portions 23 may be formed in at least one of the island portions 26. In this embodiment, one concave portion 23 is formed in the island portion 261, three concave portions 23 are formed in the island portion 262, one concave portion 23 is formed in the island portion 263 and two concave portions 23 are formed in the island portion 264. The arrangement of concave portions is not limited to this embodiment but may be arbitrary. For example, the concave portions 23 may be formed in the island portion 265 or may not be formed in the island portion 261 or the island portion 263.

The resist layer 2 may be formed by forming a resist layer on the entire surface of the base 11, forming a mask on the resist layer and etching a portion of the resist layer. The concave portions 23 may be formed simultaneously with the gap 29 and so on, or may be formed by forming a plurality of island portions in which the concave portions 23 are not formed and etching a portion of each of the island portions.

The semiconductor element 3 shown in FIGS. 6 to 8 is disposed on the base 11. Specifically, the semiconductor element 3 is disposed on the base 11 via the wiring pattern 12. The resist layer 2 is not formed in a region where the semiconductor element 3 is disposed. The semiconductor element 3 is bonded to the die bonding portion 121A in the wiring pattern 12. In this embodiment, the semiconductor element 3 may be an optical element. In a detailed example, the optical element is a light emitting element or a light receiving element. In this embodiment, the semiconductor element 3 may be a light emitting element which emits a blue light. Alternatively, the semiconductor element 3 may be a light emitting element which emits another light, for example, a light other than the blue light. In another embodiment, the semiconductor element 3 may be a diode other than the optical element.

In this embodiment, the semiconductor element 3 is a bare chip LED. In other words, the semiconductor element 3 includes an n type semiconductor layer, an active layer and a p type semiconductor layer. The n type semiconductor layer is stacked on the active layer. The active layer is stacked on the p type semiconductor layer. The active layer is interposed between the n type semiconductor layer and the p type semiconductor layer. The n type semiconductor layer, the active layer and the p type semiconductor layer are made of, for example, GaN. Electrodes (not shown) are formed in upper and lower surfaces of the semiconductor element 3.

One or more wires 77 shown in FIGS. 6 and 7 are bonded to both of the semiconductor element 3 and the wiring pattern 12. Specifically, the wires 77 are bonded to the semiconductor element 3 and the wire bonding portion 121C in the wiring pattern 12. This allows for an electrical conduction between the semiconductor element 3 and the wiring pattern 12.

As shown in FIG. 8, the bonding layer 71 bonds the semiconductor element 3 and the wiring pattern 12 together. The bonding layer 71 is interposed between the semiconductor element 3 and the wiring pattern 12 (specifically, the die bonding portion 121A). The bonding layer 71 directly contacts with both of the semiconductor element 3 and the wiring pattern 12. The bonding layer 71 is made of a conductive material such as Ag or a solder. Alternatively, for example, two wires may be bonded to the semiconductor element 3. In this case, the bonding layer 71 may be made of an insulating material.

The resin-sealed portion 5 shown in FIGS. 1 to 4, 8 and 9 covers the base 11, the wiring pattern 12, the resist layer 2, the semiconductor element 3, the bonding layer 71, and the wire 77. The resin-sealed portion 5 is disposed on the base front surface 111 of the base 11 and does not have a portion located on the base rear surface 112. The resin-sealed portion 5 is made of an insulating material. In this embodiment, since the semiconductor element 3 is an optical element, the resin-sealed portion 5 is made of a transparent material. Specifically, if the semiconductor element 3 is a light emitting element, the resin-sealed portion 5 is made of a material that transmits a light emitted from the light emitting element. If the semiconductor element 3 is a light receiving element, the resin-sealed portion 5 is made of a material that transmits a light which may be received by the semiconductor element 3. The resin-sealed portion 5 is, for example, epoxy resin, silicone resin, acryl resin or polyvinyl resin. A fluorescent material may be mixed in the resin-sealed portion 5. The resin-sealed portion 5 may be formed by molding.

A part of the resin-sealed portion 5 may fill each of the plurality of concave portions 23. In this embodiment, as described above, since the concave portions 23 penetrate through the resist layer 2, the resin-sealed portion 5 is in contact with a portion of the base front surface 111 which is exposed from the concave portions 23.

The dimension of the resin-sealed portion 5 in the thickness direction Z of the base 11 may range from about 0.3 mm to 3.0 mm. A proportion of the area occupied by the resin-sealed portion 5 with respect to the base 11 in the thickness direction Z of the base 11 may range from about 10% to 100%.

As shown in FIGS. 1 to 3 and so on, the resin-sealed portion 5 has an outer surface 51 oriented from the base 11. The outer surface 51 is exposed to the external space of the semiconductor device 100. A part of the resin-sealed portion 5 forming the outer surface 51 has the same material as a part of the resin-sealed portion 5 in contact with the semiconductor element 3. For example, if the material of the part of the resin-sealed portion 5 forming the outer surface 51 is epoxy resin, the material of the part of the resin-sealed portion 5 in contact with the semiconductor element 3 is also epoxy resin. In addition, the composition of the epoxy resin in the part of the resin-sealed portion 5 in contact with the semiconductor element 3 may be the same as the composition in the part forming the outer surface 51.

The shape of the resin-sealed portion 5 is not limited to the disclosure shown in FIG. 1 and so on. For example, the resin-sealed portion 5 may have a rectangular shape having a longer side in the first direction X when viewed from the front.

In some cases, a relationship in linear expansion coefficient between the base 11, the resist layer 2 and the resin-sealed portion 5 may be as follow.

The linear expansion coefficient of the material of the resin-sealed portion 5 is larger than that of the material of the base 11 and that of the material of the resist layer 2. For example, the linear expansion coefficient may be about 10 to 500 ppm/K for the material of the base 11, about 10 to 500 ppm/K for the material of the resist layer 2, and about 10 to 500 ppm/K for the material of the resin-sealed portion 5. Specifically, if the base 11 is made of glass epoxy resin, its linear expansion coefficient may be about 100 ppm/K. If the base 11 is made of ceramics, its linear expansion coefficient may be about 5 ppm/K. If the resist layer 2 is made of epoxy resin, its linear expansion coefficient may be about 150 ppm/K. If the resist layer 2 is made of pigment, its linear expansion coefficient may be about 100 ppm/K. If the resin-sealed portion 5 is made of epoxy resin, its linear expansion coefficient may be about 150 ppm/K. If the resin-sealed portion 5 is made of silicone resin, its linear expansion coefficient may be about 120 ppm/K. If the resin-sealed portion 5 is made of polyvinyl resin, its linear expansion coefficient may be about 120 ppm/K. If the resin-sealed portion 5 is made of acryl resin, its linear expansion coefficient may be about 150 ppm/K.

Next, operations and effects of this embodiment will be described.

In this embodiment, the plurality of concave portions 23 is formed in the resist layer 2 and is filled with a part of the resin-sealed portion 5. This configuration may allow the area of contact between the resin-sealed portion 5 and the resist layer 2 to be increased, which results in a stronger bonding between the resin-sealed portion 5 and the resist layer 2. With such a configuration, even when the semiconductor device 100 is heated when performing a reflow process under a condition that the semiconductor device 100 is mounted on the circuit board 801, it is possible to prevent the resin-sealed portion 5 from being peeled off or separated from the base 11. In addition, it is possible to prevent the semiconductor element 3 from being separated from the base 11 if the semiconductor device 100 is mounted on the circuit board 801. In such a manner, the reliability of the semiconductor device 100 may be improved.

In this embodiment, each of the plurality of concave portions 23 has the concave portion side 231 in contact with the resin-sealed portion 5. The concave portion side 231 is inclined with respect to the thickness direction Z of the base 11 in such a manner that the opening area of the concave portion 23 is increased as the concave portion 23 becomes closer to the base 11. This configuration may allow the resin-sealed portion 5 and the resist layer 2 to engage each other in the concave portions 23, which results in stronger bonding between the resin-sealed portion 5 and the resist layer 2. Thanks to this configuration, it is possible to more suitably prevent the semiconductor element 3 from being separated or peeled off from the base 11 if the semiconductor device 100 is mounted on the circuit board 801. In such a manner, the reliability of the semiconductor device 100 may be further improved.

In this embodiment, any two (i.e., a pair) of the plurality of concave portions 23 are located opposite to each other in parallel to the thickness direction Z of the base 11, with the virtual plane V1 passing through the semiconductor element 3 interposed therebetween. This configuration allows for the resin-sealed portion 5 and the resist layer 2 to be more strongly bonded together. With such a configuration, it is possible to more suitably prevent the semiconductor element 3 from being separated or peeled off from the base 11 if the semiconductor device 100 is mounted on the circuit board 801, which results in improving the stability and reliability of the semiconductor device 100.

In this embodiment, the linear expansion coefficient of the material of the resin-sealed portion 5 is larger than that of the material of the resist layer 2. With this configuration, when the resin-sealed portion 5 and the resist layer 2 vary the same extent of increase in temperature, the resin-sealed portion 5 is more thermally expanded than the resist layer 2. As a result, the part of the resin-sealed portion 5 filled in the concave portions 23 is pressed against the concave portion side 231 of the concave portions 23, thereby providing stronger engagement of the resin-sealed portion 5 and the resist layer 2. Such a configuration may prevent the resin-sealed portion 5 from being peeled off or separated from the resist layer 2. In addition, it is possible to suitably prevent the semiconductor element 3 from being separated or peeled off from the base 11 if the semiconductor device 100 is mounted on the circuit board 801, which results in improving the reliability of the semiconductor device 100.

First Modification of First Embodiment

A first modification of the first embodiment of the present disclosure will be described below with reference to FIG. 10.

In the following description, the same or similar elements as the first embodiment are denoted by the same reference numerals and explanation of which will not be repeated for the purpose of brevity.

Figure 10:
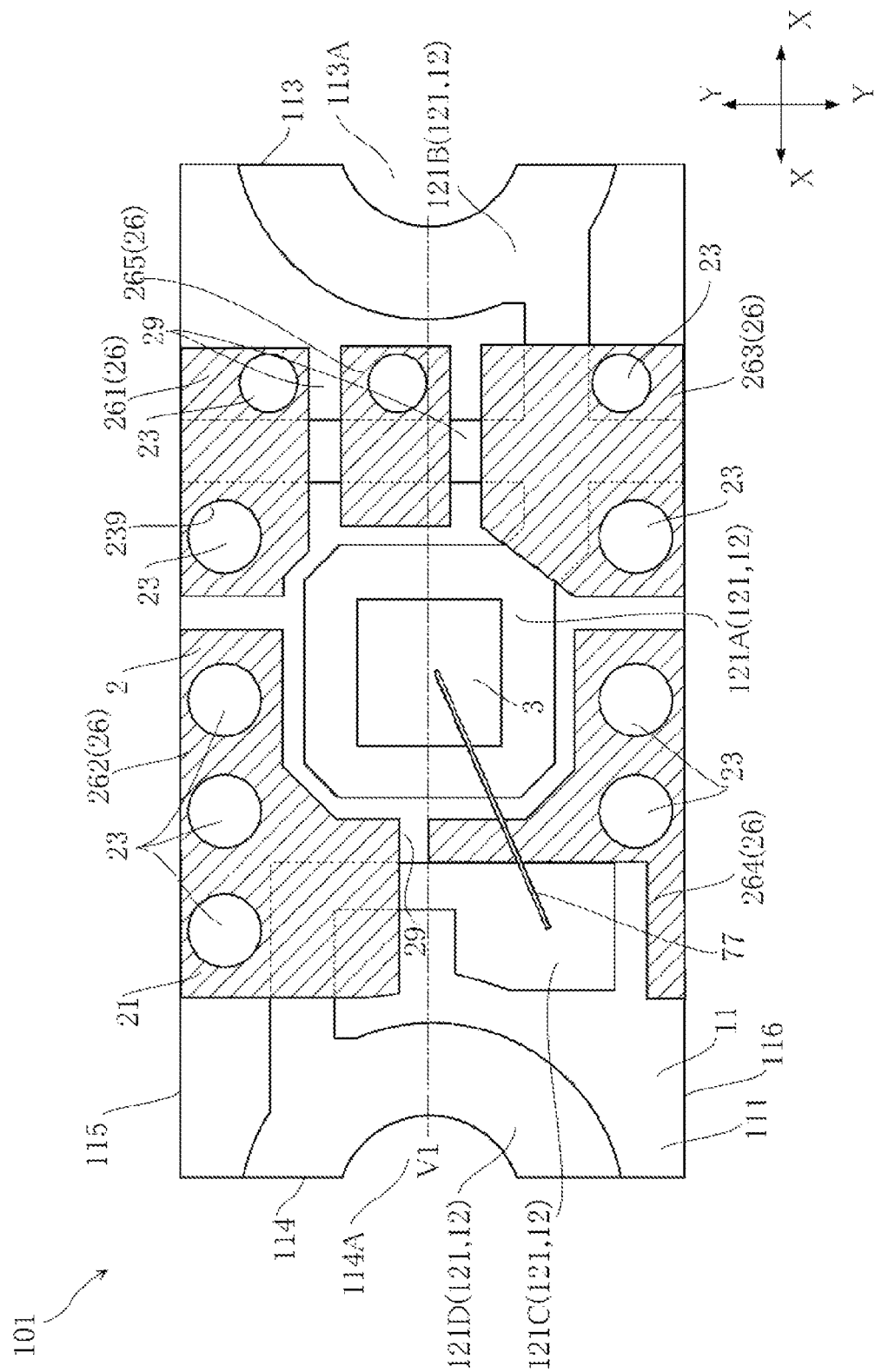
FIG. 10 is a plan view of a semiconductor device (in which the resin-sealed portion is omitted) according to a first modification of the first embodiment of the present disclosure.

FIG. 10 is a plan view of a semiconductor device (in which the resin-sealed portion is omitted) according to a first modification of the first embodiment of the present disclosure.

In a semiconductor device 101 according to this modification, a greater number of concave portions 23 may be formed in the resist layer 2 than that shown in FIG. 6. In this modification, ten concave portions 23 are formed in the resist layer 2. These concave portions 23 are arranged to surround the semiconductor element 3 in the thickness direction Z of the base 11.

This configuration may allow the resin-sealed portion 5 and the resist layer 2 to be more strongly bonded together. With such a configuration, it is possible to more suitably prevent the semiconductor element 3 from being separated or peeled off from the base 11 if the semiconductor device 100 is mounted on the circuit board 801, which results in improving the stability and reliability of the semiconductor device 100.

Second Modification of First Embodiment

A second modification of the first embodiment of the present disclosure will be described below with reference to FIG. 11.

FIG. 11 is a partial sectional view of a semiconductor device according to a second modification of the first embodiment of the present disclosure.

In a semiconductor device 102 according to this modification, at least one of the plurality of concave portions 23 may have a concave portion bottom surface 232 defined by the resist layer 2. That is, the plurality of concave portions 23 does not penetrate through the resist layer 2. In order to obtain these concave portions 23, an island portion where the concave portions 23 are not formed may be formed and then the concave portions 23 may be formed in the island portion. The configuration of this modification may show the same or similar operations and effects as the semiconductor device 100 as described above.

The present disclosure is not limited to the above-described embodiment and modifications but may be modified in different ways.

While certain embodiments have been described, these embodiments have been presented by way of example only, and are not intended to limit the scope of the disclosure. Indeed, the novel methods and apparatuses described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device comprising:
   a base;
   a semiconductor element disposed on the base;
   a wiring pattern formed on a front surface of the base, and made of conductive material;
   a resist layer formed on the front surface of the base, and covering at least a portion of the wiring pattern;
   a resin-sealed portion covering the semiconductor element and the resist layer; and a plurality of concave portions formed through first portions of the resist layer, different from second portions of the resist layer covering the at least the portion of the wiring pattern, exposing the front surface of the base from the resist layer, and each of the plurality of concave portions filled with a part of the resin-sealed portion to strongly engage the resist layer and the resin-sealed portion.

2. The semiconductor device of claim 1, wherein each of the plurality of concave portions has a concave portion side in contact with the resin-sealed portion, and wherein the concave portion side is inclined with respect to a thickness direction of the base such that the opening area of the concave portion is increased as the concave portion becomes closer to the base.

3. The semiconductor device of claim 1, wherein each of the plurality of concave portions has a shape which falls within a circle having a diameter of 0.5 mm.

4. The semiconductor device of claim 1, wherein the resist layer has a resist layer front surface which is disposed to face the same direction as the base front surface, and wherein each of the plurality of concave portions has a shape recessed from the resist layer front surface.

5. The semiconductor device of claim 1, wherein an edge of each of the plurality of concave portions forms a closed line when viewed in a thickness direction of the base.

6. The semiconductor device of claim 1, wherein each of the plurality of concave portions has a circular shape when viewed in a thickness direction of the base.

7. The semiconductor device of claim 1, wherein at least one of the plurality of concave portions penetrates through the resist layer.

8. The semiconductor device of claim 1, wherein at least one of the plurality of concave portions has a concave portion bottom surface, corresponding to the front surface of the base, surrounded by the resist layer.

9. The semiconductor device of claim 1, wherein the plurality of concave portions includes a first and a second concave portions located opposite to each other in a direction perpendicular to a thickness direction of the base, with a virtual plane passing through the semiconductor element interposed therebetween.

10. The semiconductor device of claim 1, wherein the plurality of concave portions is arranged to surround the semiconductor element when viewed in a thickness direction of the base.

11. The semiconductor device of claim 1, further comprising a front surface electrode formed on the base, wherein the plurality of concave portions is formed in a region of the base which does not overlap with the front surface electrode when viewed in a thickness direction of the base.

12. The semiconductor device of claim 11, wherein the front surface electrode includes a die bonding portion on which the semiconductor element is disposed.

13. The semiconductor device of claim 1, wherein the resist layer is made of epoxy resin or a pigment.

14. The semiconductor device of claim 1, wherein a thickness of the resist layer is 20 to 100 μm.

15. The semiconductor device of claim 1, wherein the resist layer includes a plurality of island portions, wherein the island portions are separated from each other via a gap, and wherein one or more of the concave portions are formed in at least one of the island portions.

16. The semiconductor device of claim 1, wherein the dimension of the resin-sealed portion in a thickness direction of the base ranges from 0.3 mm to 3.0 mm.

17. The semiconductor device of claim 1, wherein a proportion of the area occupied by the resin-sealed portion with respect to the base when viewed in a thickness direction of the base ranges from 10% to 100%.

18. The semiconductor device of claim 1, wherein the resin-sealed portion has an outer surface oriented from the base, and wherein the outer surface is exposed to an external space of the semiconductor device.

19. The semiconductor device of claim 18, wherein a part of the resin-sealed portion forming the outer surface has the same material as a part of the resin-sealed portion in contact with the semiconductor element.

20. The semiconductor device of claim 1, wherein a linear expansion coefficient of a material of the resin-sealed portion is larger than that of a material of the base.

21. The semiconductor device of claim 1, wherein a linear expansion coefficient of a material of the resin-sealed portion is larger than that of a material of the resist layer.

22. The semiconductor device of claim 1, wherein a linear expansion coefficient is 10 to 500 ppm/K for a material of the resin-sealed portion, wherein a linear expansion coefficient is 10 to 500 ppm/K for a material of the resist layer, and wherein a linear expansion coefficient is 10 to 500 ppm/K for a material of the base.

23. The semiconductor device of claim 1, wherein the resin-sealed portion is made of epoxy resin, silicone resin, acryl resin or polyvinyl resin.

24. The semiconductor device of claim 1, wherein the resin-sealed portion is in contact with the base.

25. The semiconductor device of claim 1, wherein the semiconductor element is an optical element, and wherein the resin-sealed portion is made of a transparent material.

26. The semiconductor device of claim 25, wherein the optical element is a light emitting element or a light receiving element.

27. The semiconductor device of claim 1, further comprising a bonding layer interposed between the semiconductor element and the base.

28. The semiconductor device of claim 27, wherein the bonding layer is made of Ag.

29. The semiconductor device of claim 1, further comprising:

a front surface electrode formed on the base; and a wire bonded to the semiconductor element and the front surface electrode.

30. The semiconductor device of claim 1, further comprising a rear surface electrode which is formed on the base and electrically connected with the semiconductor element, wherein the rear surface electrode is located opposite to the side where the semiconductor element is disposed, with the base interposed therebetween.

31. The semiconductor device of claim 1, wherein the base is made of insulating resin or ceramics.

* * * * *